(12) United States Patent
Chaung et al.

(10) Patent No.: US 9,444,462 B2
(45) Date of Patent: Sep. 13, 2016

(54) STABILIZATION OF OUTPUT TIMING DELAY

(71) Applicant: Macronix International Co., Ltd., Hsinchu (TW)

(72) Inventors: Yu-Meng Chaung, Taoyuan (TW); Chun-Hsiung Hung, Hsinchu (TW); Kuen-Long Chang, Taipei (TW); Ken-Hui Chen, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 168 days.

(21) Appl. No.: 14/458,936

(22) Filed: Aug. 13, 2014

(65) Prior Publication Data

US 2016/0049925 A1    Feb. 18, 2016

(51) Int. Cl.
  *H03K 3/00* (2006.01)
  *H03K 19/0185* (2006.01)
  *H03K 19/003* (2006.01)

(52) U.S. Cl.
  CPC *H03K 19/018521* (2013.01); *H03K 19/00384* (2013.01)

(58) Field of Classification Search
  CPC .............................. H03K 3/001; H03K 3/012
  USPC ....................................................... 327/108
  See application file for complete search history.

(56) References Cited

U.S. PATENT DOCUMENTS

| | | |
|---|---|---|
| 4,234,920 A | 11/1980 | Van Ness et al. |
| 4,584,494 A | 4/1986 | Arakawa et al. |
| 5,047,659 A | 9/1991 | Ullrich |
| 5,155,379 A | 10/1992 | Narahara |
| 5,498,987 A | 3/1996 | Nelson |
| 5,825,219 A | 10/1998 | Tsai |
| 5,923,183 A | 7/1999 | Kim et al. |
| 6,078,168 A | 6/2000 | Paolo |
| 6,097,219 A | 8/2000 | Urata et al. |
| 6,232,814 B1* | 5/2001 | Douglas, III ...... H03K 19/0005 327/281 |
| 6,380,770 B1 | 4/2002 | Pasqualini |
| 6,452,428 B1* | 9/2002 | Mooney ............... H03K 17/164 326/30 |
| 6,704,818 B1* | 3/2004 | Martin ................. H03K 17/164 710/100 |
| 6,710,617 B2* | 3/2004 | Humphrey ........... H03K 17/164 326/26 |
| 6,864,726 B2 | 3/2005 | Levin et al. |
| 7,075,353 B1 | 7/2006 | Wan et al. |
| 7,138,841 B1 | 11/2006 | Li et al. |
| 7,142,005 B1 | 11/2006 | Gaboury |
| 7,215,144 B2* | 5/2007 | Mitby ................. H04L 25/0288 326/30 |
| 7,459,952 B2 | 12/2008 | Ogita |
| 7,482,759 B2 | 1/2009 | Yoneyama et al. |
| 7,521,975 B2 | 4/2009 | Biesterfeldt et al. |
| 7,940,549 B2 | 5/2011 | Stembridge et al. |
| 7,961,027 B1 | 6/2011 | Chen et al. |

(Continued)

*Primary Examiner* — Ryan Jager
(74) *Attorney, Agent, or Firm* — Haynes Beffel & Wolfeld LLP

(57) ABSTRACT

An integrated circuit includes an output buffer and a control circuit. The output buffer has a signal input, a signal output, and a set of control inputs. The output buffer has an output buffer delay, and a driving strength adjustable in response to control signals applied to the set of control inputs. Alternatively, the output buffer delay is variable. The control circuit is connected to the set of control inputs of the output buffer. The control circuit uses first and second timing signals to generate the control signals, and can include a first delay circuit that generates the first timing signal with a first delay, and a second delay circuit that generates the second timing signal with a second delay that correlates with the output buffer delay.

16 Claims, 17 Drawing Sheets

(56) References Cited

U.S. PATENT DOCUMENTS

| | | |
|---|---|---|
| 8,060,771 B2 | 11/2011 | Tyrrell |
| 8,314,757 B2 | 11/2012 | Osaka |
| 8,643,404 B1 * | 2/2014 | Chaung .............. H03K 17/145 326/87 |
| 8,736,331 B2 | 5/2014 | Chen |
| 8,922,254 B2 | 12/2014 | Yang et al. |
| 2001/0026177 A1 | 10/2001 | Iliasevitch |
| 2005/0156836 A1 | 7/2005 | Yoneyama et al. |
| 2007/0210832 A1 * | 9/2007 | Abel .................. H03K 5/01 326/93 |
| 2007/0274138 A1 | 11/2007 | Ogiwara et al. |
| 2008/0079458 A1 * | 4/2008 | Shin .............. H03K 19/00384 326/30 |
| 2008/0158760 A1 | 7/2008 | Moyer et al. |
| 2008/0297234 A1 | 12/2008 | Moholt et al. |
| 2008/0309383 A1 | 12/2008 | Yada et al. |
| 2009/0009003 A1 | 1/2009 | Roth et al. |
| 2009/0140777 A1 | 6/2009 | Morisson |
| 2009/0224829 A1 | 9/2009 | Johansson |
| 2009/0243708 A1 | 10/2009 | Marinca |
| 2010/0007428 A1 | 1/2010 | Nezuka |
| 2010/0289548 A1 | 11/2010 | Cheng |
| 2011/0181256 A1 | 7/2011 | Ulbrich et al. |
| 2011/0181630 A1 | 7/2011 | Smith et al. |
| 2012/0086470 A1 * | 4/2012 | Diffenderfer ............ H03K 5/04 326/30 |
| 2012/0119792 A1 * | 5/2012 | Wang .................. H04L 25/028 327/108 |
| 2014/0032799 A1 | 1/2014 | Dickson et al. |
| 2014/0043892 A1 | 2/2014 | Lee et al. |
| 2014/0103965 A1 | 4/2014 | Wang et al. |
| 2014/0210522 A1 | 7/2014 | Yang et al. |

\* cited by examiner

Reference
Delay Circuits

STABILIZATION OF OUTPUT TIMING DELAY

BACKGROUND

1. Field of the Invention

The present technology relates to digital circuits and more particularly to output buffers of digital circuits.

2. Description of Related Art

An output buffer in an integrated circuit may be used to receive internal data at low current levels and present it to external loading at higher current levels. The output timing of the output buffer may vary with process corners, voltages, and temperatures (PVT). Variations in output timing due to PVT conditions may reduce the data valid window. The higher the operating speed, the more likely the reduced data valid window may affect the performance and even the reliability of the integrated circuit.

One known output buffer is described in U.S. Pat. No. 8,643,404, directed to "Self-Calibration of Output Buffer Driving Strength". In the '404 Patent, the output driving strength is changed iteratively, where the result of any iterative change results in either a "stronger" or "weaker" driving strength. If the initial driving strength is far off, then reaching the ideal driving strength may require multiple iterations.

It is desirable to provide an output buffer that is substantially insensitive to PVT conditions and thus provide reliable performance for high speed operations of integrated circuits, and have good results for consistent output buffer timing delay, with a less iterative approach to reaching an ideal output buffer timing delay.

SUMMARY

One aspect of the technology is an integrated circuit comprising an output buffer, a plurality of sequential circuits, and a control circuit.

The output buffer has an output buffer delay, a signal input and a signal output. The output buffer has a variable number of a plurality of output drivers that are on, in response to output driver control signals.

The plurality of sequential circuits receive as input first and second timing signals, and relative timing of the first and second timing signals determines the variable number of output drivers. In one embodiment, the first timing signal is generated from a first delay circuit. In one embodiment, the second timing signal is generated with a second delay that correlates with the output buffer delay. The variable number of output drivers can depend on a number of the sequential circuits transited by the second timing signal until the plurality of sequential circuits receive the first timing signal.

The control circuit performs the actions of: (i) using the first delay circuit to generate the first timing signal with a first delay, (ii) using a second delay circuit to generate the second timing signal with the second delay that correlates with the output buffer delay, (iii) using the plurality of sequential circuits to generate the output driver control signals, and (iv) causing the variable number of the plurality of output drivers to be on, in response to the output driver control signals.

Another aspect of the technology is an integrated circuit comprising an output buffer, a plurality of sequential circuits, a plurality of delay circuits, and a control circuit.

The output buffer has an output buffer delay, a signal input and a signal output, and a control signal input receiving an output driver control signal.

The plurality of sequential circuits receive as input first and second timing signals. The first timing signal is generated from a first delay circuit. The second timing signal is generated with a second delay that correlates with the output buffer delay.

The plurality of delay circuits generate a variable delay determining the output buffer delay. The variable delay depends on a number of the plurality of sequential circuits transited by the second timing signal until the plurality of sequential circuits receive the first timing signal.

The control circuit performs the actions of: (i) using the first delay circuit to generate the first timing signal with a first delay, (ii) using a second delay circuit to generate the second timing signal with the second delay that correlates with the output buffer delay, (iii) using the plurality of sequential circuits to generate the output driver control signal, and (iv) causing the output driver control signal to undergo the variable delay in order to reach the output buffer.

Another aspect of the technology is a method for controlling an output buffer, where the output buffer has an output buffer delay. The method includes:
  generating a first timing signal with a first delay;
  generating a second timing signal with a second delay that correlates with the output buffer delay; and
  adjusting a variable number of output drivers that are on in a plurality of output drivers in the output buffer, in response to a number of sequential circuits of a plurality of sequential circuits transited by the first timing signal upon receipt by the plurality of sequential circuits of the first timing signal.

Another aspect of the technology is a method for controlling an output buffer, where the output buffer has an output buffer delay. The method includes:
  generating a first timing signal with a first delay;
  generating a second timing signal with a second delay that correlates with the output buffer delay;
  adjusting a variable delay of a plurality of delay circuits in response to a number of sequential circuits of a plurality of sequential circuits transited by the first timing signal upon receipt by the plurality of sequential circuits of the first timing signal; and
  causing an output buffer control signal to undergo the variable delay in order to reach the output buffer.

In various embodiments of the technology, delay circuits in the plurality of delay circuits include a series of inverters.

In various embodiments of the technology, the output buffer delay depends on the variable delay generated by the plurality of delay circuits.

In various embodiments of the technology, sequential circuits in the plurality of sequential circuits include a flip-flop and combinational logic.

In various embodiments of the technology, the first delay circuit responds to a reference signal to generate the first timing signal with the first delay, and the first delay is substantially insensitive to at least one of process, voltage and temperature (PVT) conditions. The second delay circuit responds to the reference signal on its input to generate the second timing signal on its output with the second delay, and the second delay correlates with changes in the output buffer delay resulting from said at least one of process, voltage and temperature (PVT) conditions.

In various embodiments of the technology, the plurality of output drivers are in parallel, and the output buffer delay is shortened or lengthened by the variable number of output drivers being more or less.

In various embodiments of the technology, the plurality of output drivers are divided into a plurality of groups of output drivers, and a same sequential circuit driver in the plurality of sequential circuits controls different output drivers within a same group of the plurality of groups of output drivers. In a further embodiment of the technology, the plurality of sequential circuits are divided into a plurality of groups of sequential circuits, and different sequential circuits in a same group of the plurality of groups of sequential circuits control the same group of the plurality of groups of output drivers.

In various embodiments of the technology, the plurality of sequential circuits are divided into a plurality of groups of sequential circuits, and different sequential circuits in a same group of the plurality of groups of sequential circuits control a same output driver in the plurality of output drivers.

In various embodiments of the technology, the plurality of sequential circuits are divided into a plurality of groups of sequential circuits, and a same delay is generated by the plurality of delay circuits responsive to different sequential circuits within a same group of the plurality of groups of sequential circuits.

In various embodiments of the technology, the plurality of sequential circuits are divided into a plurality of groups of sequential circuits, and the variable delay is a same value caused by output driver signals generated from different sequential circuits within a same group of the plurality of groups of sequential circuits.

Other aspects and advantages of the present technology can be seen on review of the drawings, the detailed description and the claims, which follow.

DETAILED DESCRIPTION

A detailed description of implementations of the present technology is provided with reference to the Figures. Preferred implementations are described to illustrate the present technology, not to limit its scope, which is defined by the claims. Those of ordinary skill in the art will recognize a variety of equivalent variations on the description that follows.

Figure 1A:
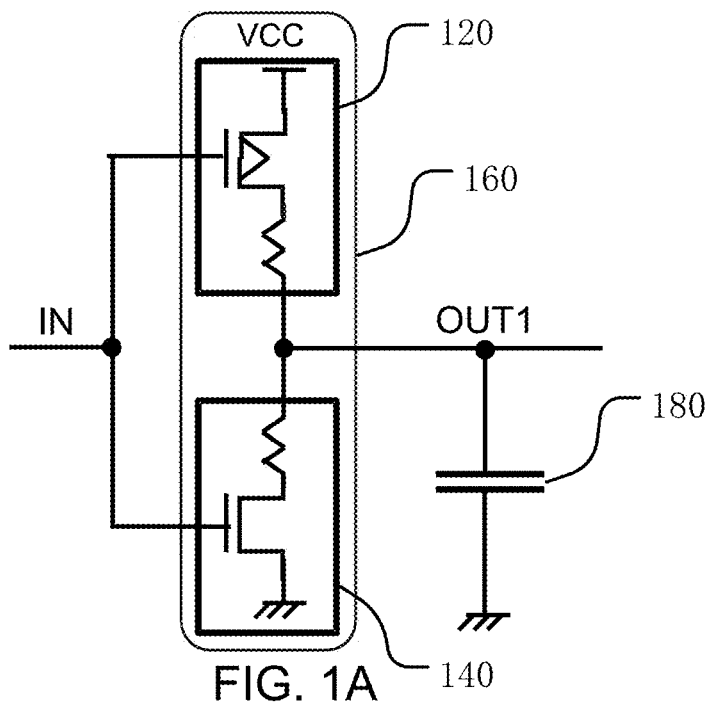
FIG. 1A is an example design of an output buffer.

FIG. 1A is an example design of an output buffer 160. The output buffer 160 includes an NMOS transistor 140 and a PMOS transistor 120 in series. The NMOS transistor 140 has a control terminal, a drain terminal and a source terminal connected to a ground potential. The PMOS transistor 120 has a control terminal, a drain terminal and a source terminal connected to a fixed reference voltage VCC. An input signal IN is coupled to the control terminals of both transistors 120 and 140 in parallel. An output signal OUT1 is coupled to the drain terminals of both transistors 120 and 140. A capacitor 180 represents external loading to the output buffer 160.

Figure 1B:
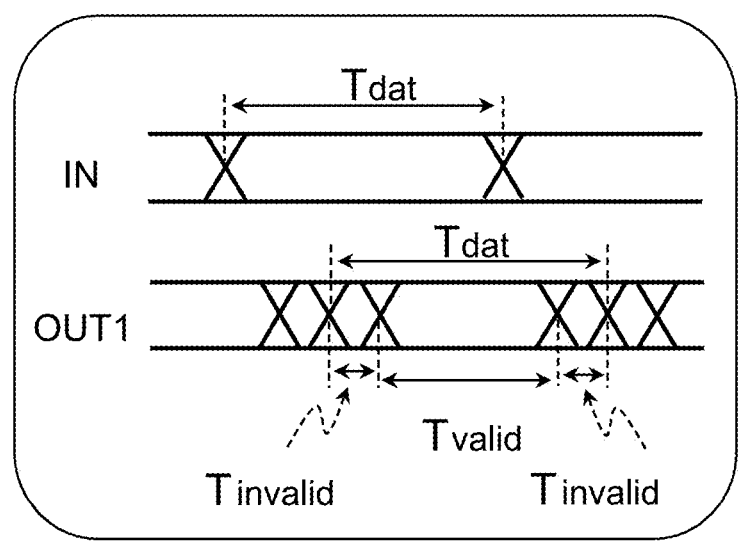
FIG. 1B illustrates waveforms associated with the output buffer in FIG. 1A.

FIG. 1B illustrates waveforms associated with the output buffer 160 in FIG. 1A. Waveforms are shown for the input signal IN, and the output signal OUT1. Tdat is the data valid window of the input signal IN. Under certain PVT conditions, the output buffer 160 may provide the same data valid window Tdat for the output signal OUT1 as the data valid window of the input signal IN. However, under other PVT conditions in which at least one of the process, voltage and temperature conditions is changed, driving strength of the output buffer 160 may decrease/increase, prolong/accelerate rising and falling edges of pulses in the output signal OUT1, and thus reduce the data valid window for the output signal OUT1 from Tdat to Tvalid. Tvalid is narrower than Tdat by the amount of twice Tinvalid because for each pulse, its rising edge is reduced by Tinvalid and its falling edge is also reduced by Tinvalid.

Figure 2:
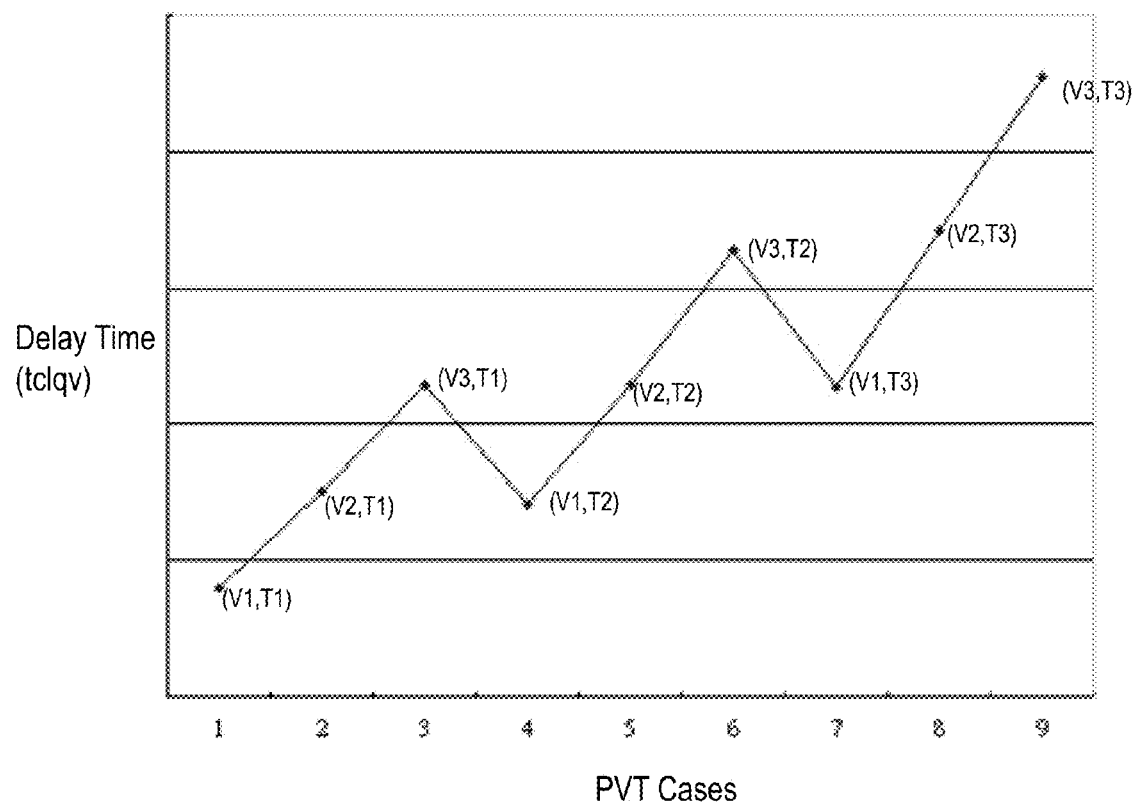
FIG. 2 is a graph of the varying buffer delay under various conditions.

FIG. 2 is a graph of the varying buffer delay under various conditions. The buffer delay is measured at combinations of different supply voltages V1, V2, V3, and different temperatures T1, T2, T3. V1 is greater than V2 which is greater than V3. T3 is greater than T2 which is greater than T1.

Figure 3A:
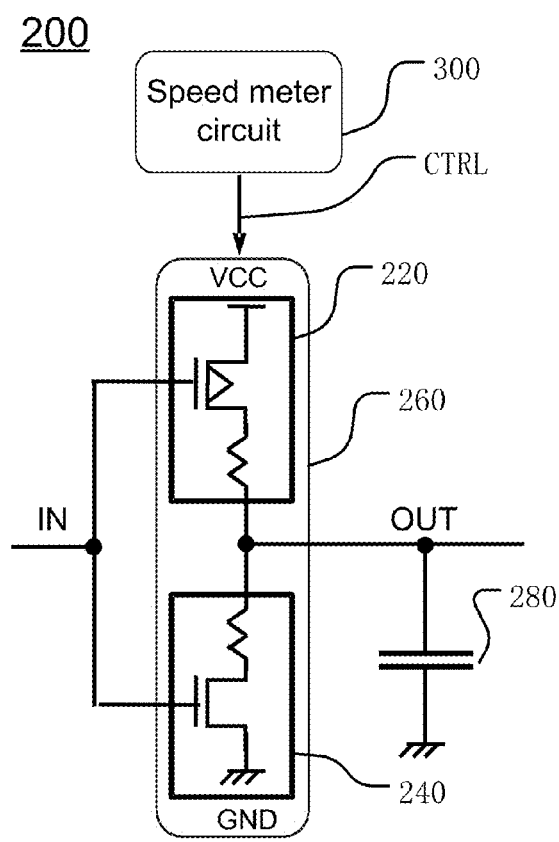
FIG. 3A is a block diagram of an example integrated circuit including output buffers having an output buffer delay controlled by a speed meter circuit.

FIG. 3A is a block diagram of an example integrated circuit 200 including output buffers having an output buffer delay controlled by a speed meter circuit. The example integrated circuit 200 includes an output buffer 260, and a speed meter circuit 300. The output buffer 260 has a signal input, a signal output, and a set of control inputs. The output buffer 260 has an output buffer delay adjustable in response to control signals CTRL applied to the set of control inputs. An input signal IN is coupled to the signal input of the output buffer 260. An output signal OUT is coupled to the signal output of the output buffer 260. A capacitor 280 is coupled to the signal output of the output buffer 260, representing capacitive loading to the output buffer 260.

Figure 3B:
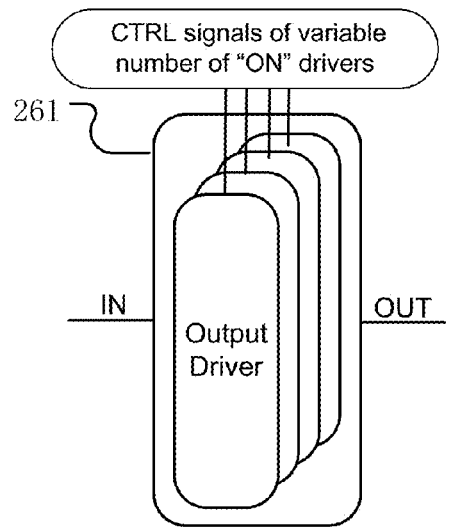
FIG. 3B illustrates an output buffer with control signals that control a variable number of output drivers that are "on".
Figure 3C:
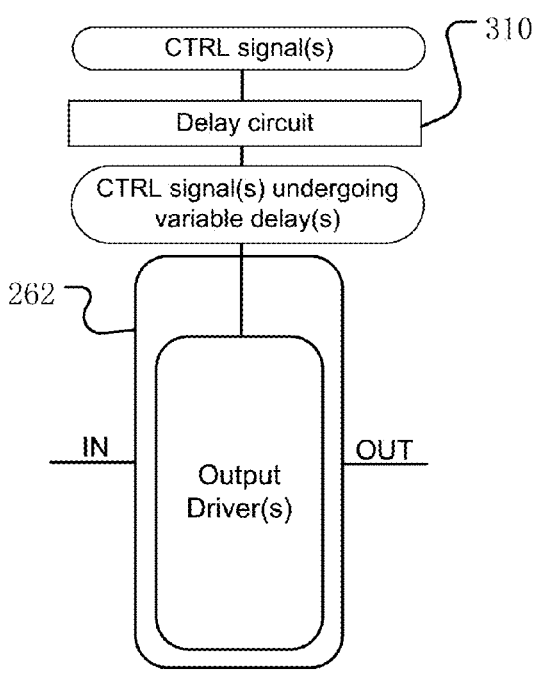
FIG. 3C illustrates an output buffer with at least one control signal undergoing at least one variable delay.

The output buffer delay of the output buffer 260 is adjustable. FIGS. 3B and 3C show different embodiments of the output buffer of FIG. 3A.

FIG. 3B illustrates an output buffer with control signals that control a variable number of output drivers that are "on". The control signals CTRL from the speed meter circuit enable or disable selected output drivers to adjust the driving strength of the output buffer 260, which in turn adjusts the output buffer delay. The more output drivers which are on, the shorter the output buffer delay. The fewer output drivers which are on, the longer the output buffer delay. The input signal IN is provided to the plurality of parallel output drivers. Further description about how the control signals CTRL select output drivers is provided in connection with FIG. 4.

The output buffer 261 includes a plurality of output drivers. Each output driver in the output buffer 261 includes a first transistor 240, and a second transistor 220. The first transistor 240 in an output driver has a first conduction terminal electrically coupled to a first fixed reference voltage GND, a second conduction terminal electrically coupled to the output terminal of the output buffer 261, and a control terminal electrically coupled to the input terminal of the output buffer 261. The first transistor 240 has a first channel type, and in one implementation, includes an NMOS (N-channel metal-oxide-semiconductor) transistor.

The second transistor 220 in an output driver has a first conduction terminal electrically coupled to the fixed reference voltage VCC, a second conduction terminal electrically coupled to the output terminal of the output buffer 261, and a control terminal electrically coupled to the input terminal of the output buffer 261. The second transistor has a second channel type opposite the first channel type, and in one implementation, includes a PMOS (P-channel metal-oxide-semiconductor) transistor.

Resolution of driving strength, and thus resolution of output buffer delay, depends on the number of output drivers in each output buffer 261. A higher number of output drivers corresponds to higher resolution. With four output drivers, the output buffer 261 has four steps in driving strength and thus output buffer delay. With sixteen output drivers, the output buffer 261 has sixteen steps in driving strength and thus output buffer delay, assuming equally sized drivers. In other embodiments, the driver sizes can vary, for example including a 1× driver, a 2× driver, a 4× driver and an 8× driver, and decoding circuitry can be used to select a combination of drivers that most effectively adjusts the total driving strength and thus adjusts the output buffer delay. Also, in other embodiments, the drivers can have strengths that are adjustable using analog control signals, such that the total output buffer delays is adjustable using the analog control signals.

FIG. 3C illustrates an output buffer with at least one control signal undergoing at least one variable delay.

At least one control signal CTRL from the speed meter circuit enables or disables one or more selected ungrouped output drivers or group of output drivers. The control signal undergoes variable delay via delay circuit 310. Following processing by the delay circuit 310, the control signal, which has undergone a variable delay, is provided to at least one output driver or group of output drivers. Further description about how the control signal CTRL is delayed is provided in connection with FIG. 18.

Unlike the output buffer 261 in FIG. 3B, the output buffer 262 in FIG. 3C can include one ungrouped output driver or one group of output drivers, rather than multiple output drivers or multiple groups of output drivers. A group of output drivers are controlled together as a unit, such that the output drivers in the same group are collectively on or off.

In another embodiment, features of FIGS. 3B and 3C are combined, such that control signals control multiple ungrouped output drivers or multiple groups of output drivers, that undergo variable delay in a delay circuit.

Figure 4:
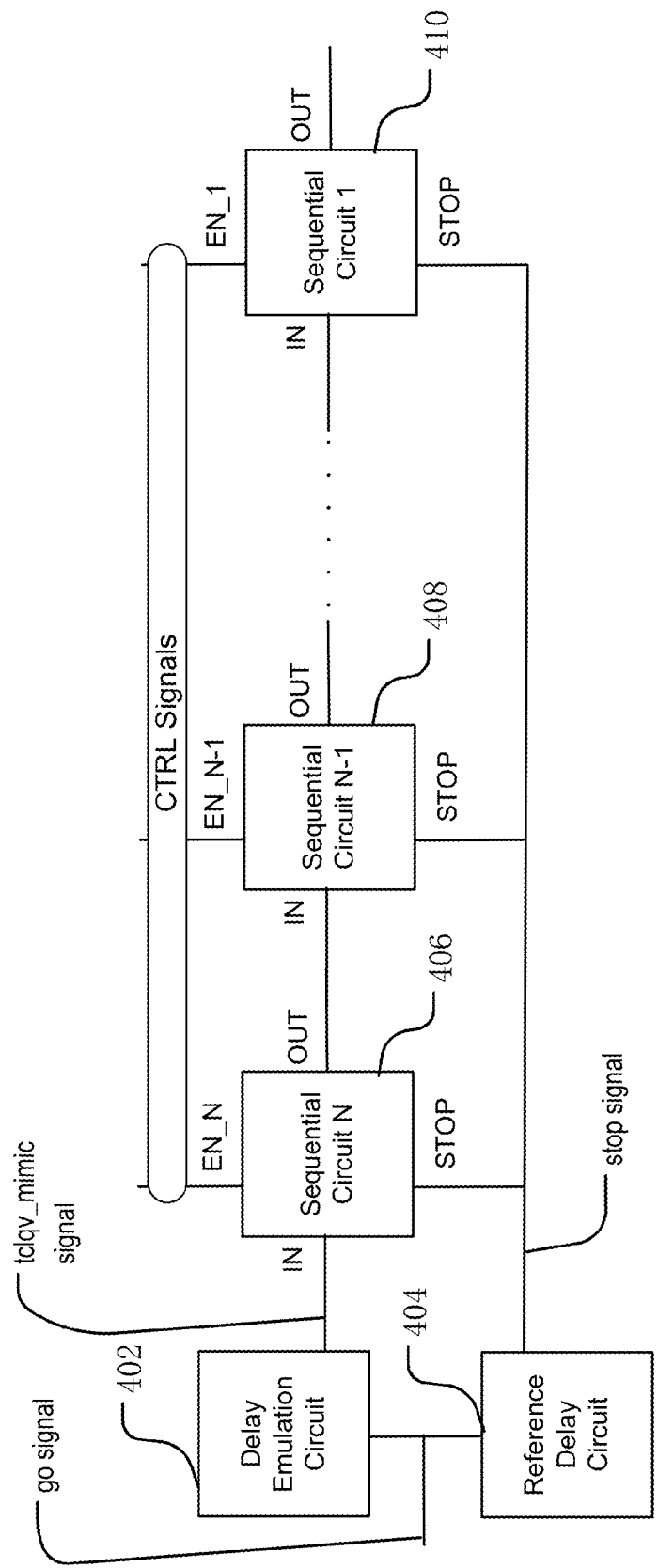
FIG. 4 is a block diagram of a speed meter circuit used in the integrated circuit in FIG. 3A.

FIG. 4 is a block diagram of a speed meter circuit used in the integrated circuit in FIG. 3A.

Figure 5:
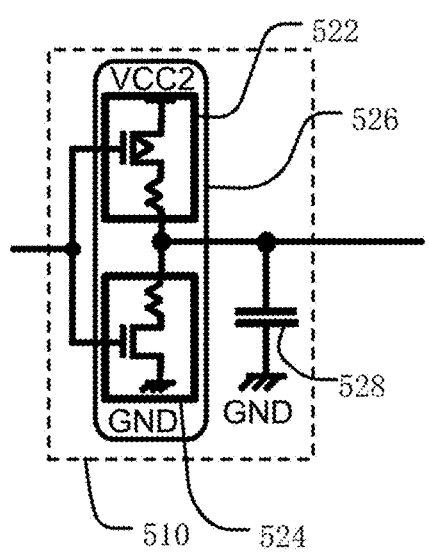
FIG. 5 is a block diagram of a delay emulation circuit used in FIG. 4.

A go signal is sent at the same time to delay emulation circuit 402 and reference delay circuit 404. Timing signals are generated with amounts of delay that are different between delay emulation circuit 402 and reference delay circuit 404. Delay emulation circuit 402 generates the tclqv_mimic timing signal following a delay which correlates with the output buffer delay. An example delay emulation circuit is shown in FIG. 5. Reference delay circuit 404 generates the stop timing signal following a delay which is substantially insensitive to at least one of process, voltage and temperature (PVT) conditions. An example reference delay circuit is shown in FIGS. 6-9.

The tclqv_mimic timing signal is received by the plurality of sequential circuits, including sequential circuit N 406, sequential circuit N-1 408, and sequential circuit 1 410. The tclqv_mimic timing signal propagates sequentially through the IN and OUT terminals of each sequential circuit in the plurality of sequential circuits, until the plurality of sequential circuits receives the stop timing signal from reference delay circuit 404. A variable number of sequential circuits is transited by the tclqv_mimic timing signal until the plurality of sequential circuits receives the stop timing signal from reference delay circuit 404 at the STOP terminal coupled in parallel to the reference delay circuit 404. This variable number of sequential circuits is an indication of the difference between the tclqv_mimic and stop timing signals.

As each sequential circuit is transited by the tclqv_mimic timing signal, each transited sequential circuit generates an EN_# signal (or alternatively, a disable signal). For example, when the tclqv_mimic timing signal transits sequential circuit N 406, sequential circuit N 406 generates the EN_N signal. When the tclqv_mimic timing signal transits sequential circuit N-1 408, sequential circuit N-1 408 generates the EN_N-1 signal. When the tclqv_mimic timing signal transits sequential circuit 1 410, sequential circuit 1 410 generates the EN_1 signal.

The various EN_# signals indicate whether a corresponding output driver is off. As more sequential circuits are transited sequentially by the tclqv_mimic timing signal until the stop timing signal is received by the plurality of sequential circuits, more of the corresponding output drivers are off FIG. 5 is a block diagram of a delay emulation circuit used in FIG. 4.

A scaled-down circuit 526 of the output buffer 260 inside the delay emulation circuit 510 includes a first scaled-down circuit 524 of the first transistor 240 of the output buffer 260, and a second scaled-down circuit 522 of the second transistor 220 of the output buffer 260.

The first scaled-down circuit 524 has a first conduction terminal electrically coupled to the first fixed reference voltage GND, a second conduction terminal electrically coupled to the output terminal of the delay emulation circuit 510, and a control terminal electrically coupled to the input terminal of the delay emulation circuit 510. The second scaled-down circuit 522 has a first conduction terminal electrically coupled to the second fixed reference voltage VCC2, a second conduction terminal electrically coupled to the output terminal of the delay emulation circuit 510, and a control terminal electrically coupled to the input terminal of the delay emulation circuit 510. For convenience of design, the second fixed reference voltage VCC2 may be the same as the fixed reference voltage VCC for the output buffer 260 (FIG. 3A). Alternatively, the second fixed reference voltage VCC2 may be different than the fixed reference voltage VCC for the output buffer 260, provided that the delay emulation circuit 510 can emulate the behavior of the output buffer 260 (FIG. 3A).

The first scaled-down circuit 524 and the second scaled-down circuit 522 in the delay emulation circuit 510 include a scaled-down NMOS transistor and a scaled-down PMOS transistor, emulating the first transistor 240 and the second transistor 220 in the output buffer 260, respectively.

The delay emulation circuit 510 also includes a capacitor 528 coupled to the output terminal of the delay emulation circuit 510. The capacitor 528 has a capacitive value scaled down from capacitive loading at the output terminal of the output buffer 260, as represented by the capacitor 280 (FIG. 3A), and with a resistance scaled up such that the RC delay of the scaled-down circuit 526 emulates the RC delay of the output buffer 260.

FIGS. 6-9 are circuit diagrams for parts of a reference delay circuit used in FIG. 4.

Figure 6:
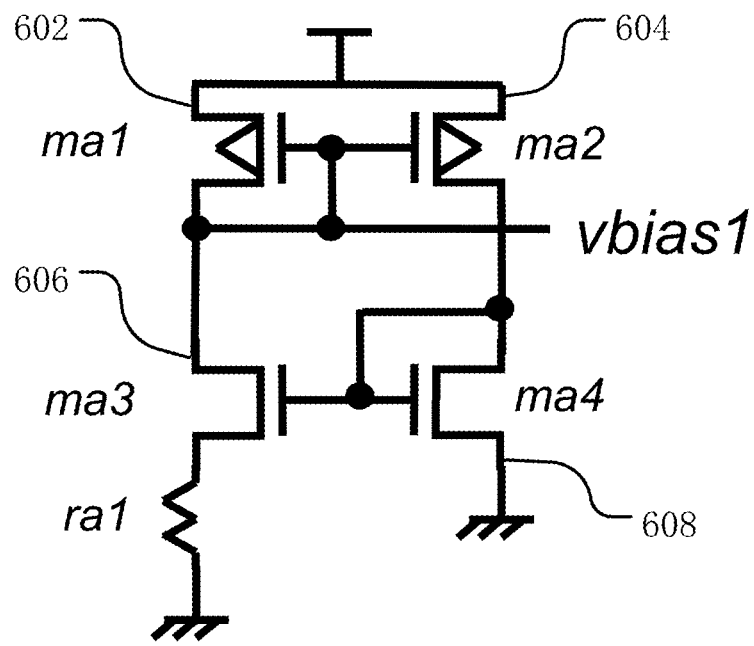
FIGS. 6-9 are circuit diagrams for parts of a reference delay circuit used in FIG. 4.

The circuit in FIG. 6 compensates for temperature variation such that the stop timing signal generated by the reference delay circuit is substantially insensitive to temperature.

P-type transistors ma1 602 and ma2 604 have sources coupled to a supply reference voltage, and gates and drains all coupled together to an output node generating vbias1. N-type transistors ma3 606 and ma4 608 have gates and drains coupled together to the output node generating vbiasl. N-type transistor ma3 606 has a source coupled to a ground reference voltage through resistance ra1. N-type transistor ma4 608 has a source coupled to a ground reference voltage. The signal vbiasl from the output node compensates for temperature variations in the stop timing signal generated by the reference delay circuit.

Figure 7:
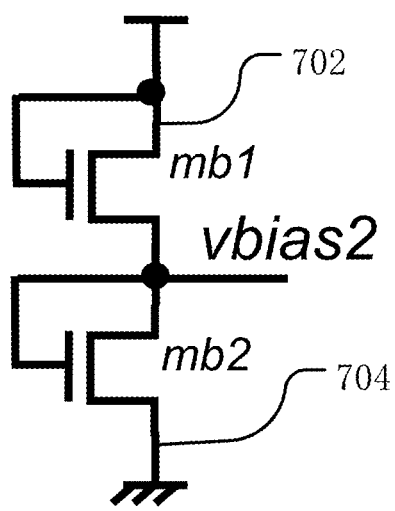

The circuit in FIG. 7 compensates for supply voltage variation such that the stop timing signal generated by the reference delay circuit is substantially insensitive to supply voltage.

N-type transistors mb1 702 and mb2 704 are coupled in series between a supply reference voltage and a ground reference voltage. N-type transistors mb1 702 and mb2 704 are diode connected, with gate and drain coupled together. An output node generating vbias 2 is coupled to the source of n-type transistor mb1 702 and to the drain of n-type transistor mb2 704. A supply reference voltage is coupled to the drain of n-type transistor mb1 702. A ground reference voltage is coupled to the source of n-type transistor mb2 704. The signal vbias2 from the output node compensates for supply voltage variations in the stop timing signal generated by the reference delay circuit.

Figure 8:
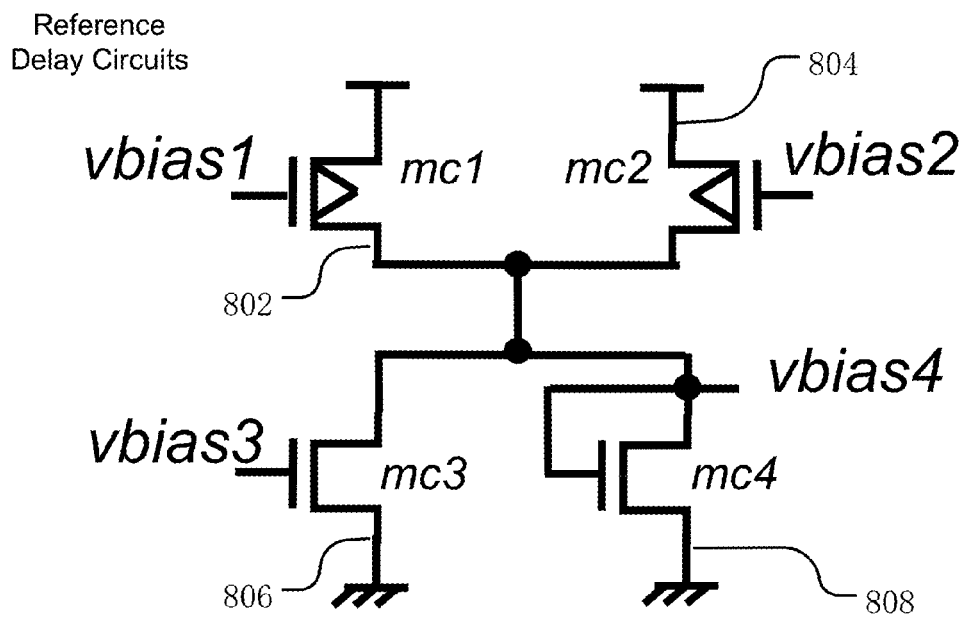

The circuit in FIG. 8 adds compensation for process corner variation such that the stop timing signal generated by the reference delay circuit is substantially insensitive to process corner.

P-type transistors mc1 802 and mc2 804 have sources coupled to a supply reference voltage, and gates and drains coupled together to an output node generating vbias4. P-type transistor mc1 802 has a gate coupled to vbias 1 from FIG. 6. P-type transistor mc2 804 has a gate coupled to vbias2 from FIG. 7. N-type transistors mc3 806 and mc4 808 have drains coupled together to the output node generating vbias4 and sources coupled to a ground reference voltage. N-type transistor mc3 806 has a gate coupled to vbias3 from a fixed voltage such as a bandgap reference. N-type transistor mc4 808, is diode connected, with gate and drain coupled together. The signal vbias4 from the output node compensates for temperature variations, supply voltage variations, and process corner variations in the stop timing signal generated by the reference delay circuit.

Figure 9:
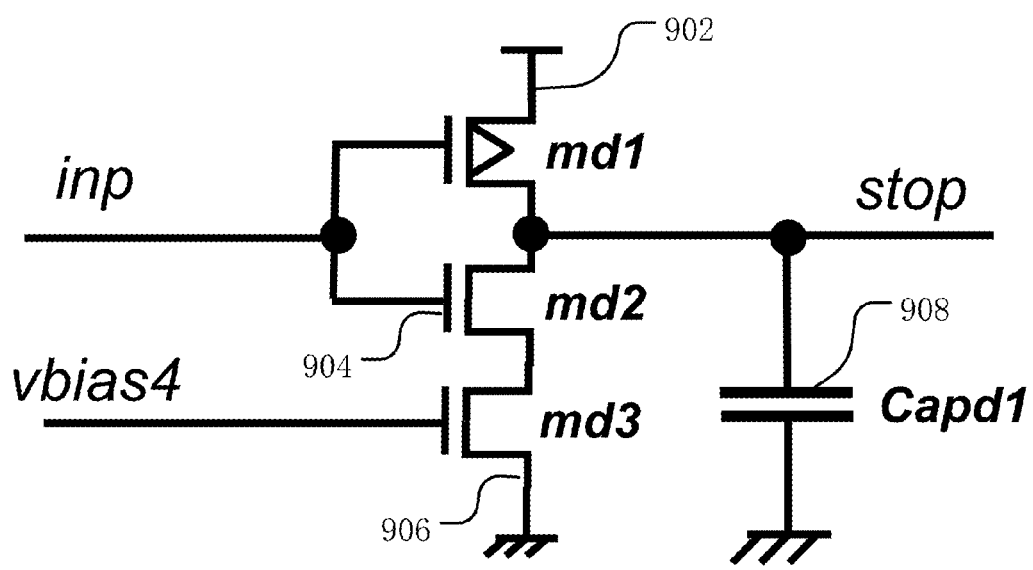

The circuit in FIG. 9 generates the stop timing signal which is substantially insensitive to temperature variations, supply voltage variations, and process corner variations.

P-type transistor md1 902 and n-type transistors md2 904 and md3 906 are coupled in series between the supply voltage reference and the ground voltage reference. P-type transistor md1 902 and n-type transistor md2 904 are coupled together like an inverter. P-type transistor md1 902 and n-type transistor md2 904 have gates coupled together to an input node to receive an input inp such as the go signal of FIG. 4, and drains coupled together to an output node generate an output such as the stop signal of FIG. 4. N-type transistor md3 906 has a gate coupled to vbias4 from FIG. 8, a source coupled to the ground voltage reference, and a drain coupled to the source of n-type transistor md2 904. Capacitor capdl 908 is coupled to the output node. The stop timing signal is substantially insensitive to temperature variations, supply voltage variations, and process corner variations.

Figure 10:
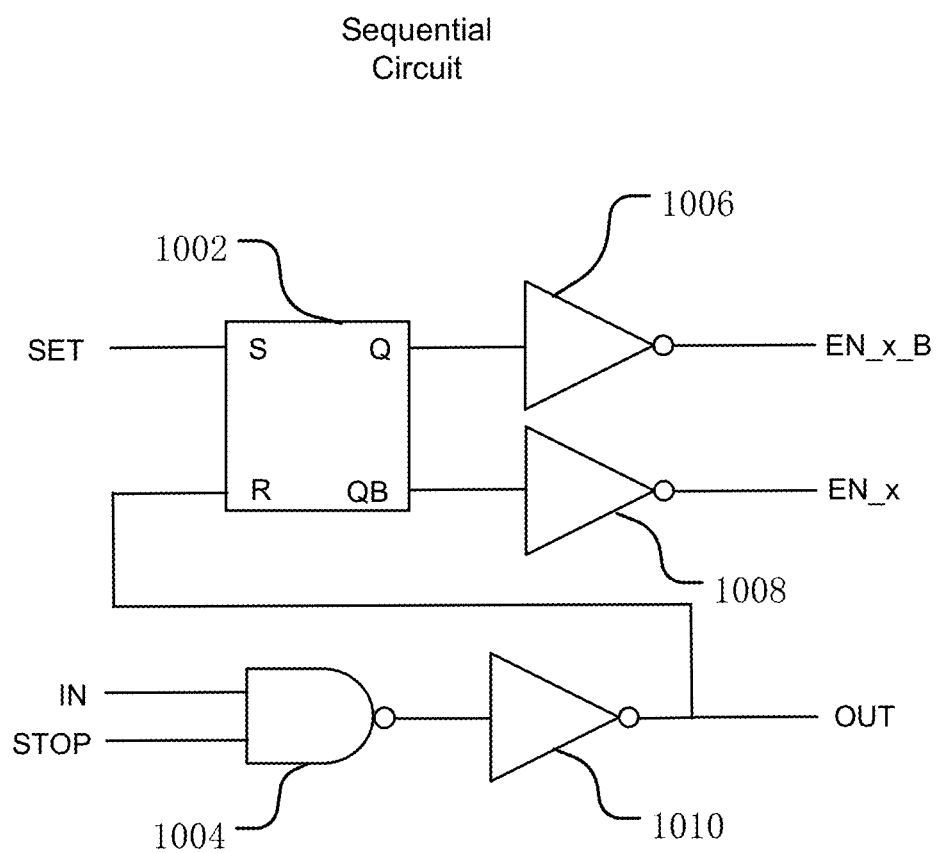
FIG. 10 is a circuit diagram of an example sequential circuit in the speed meter circuit of FIG. 4.

FIG. 10 is a circuit diagram of an example sequential circuit in the speed meter circuit of FIG. 4.

NAND gate 1004 receives as inputs a stop timing signal such as in FIG. 4 and an IN signal. The stop timing signal is received from a reference delay circuit in parallel together with other sequential circuits. The IN signal is received from the OUT signal of the preceding sequential circuit. The IN signal of the first sequential circuit in the plurality of sequential circuits is the tclqv_mimic timing signal from the delay emulation circuit of FIG. 4.

Figure 14:
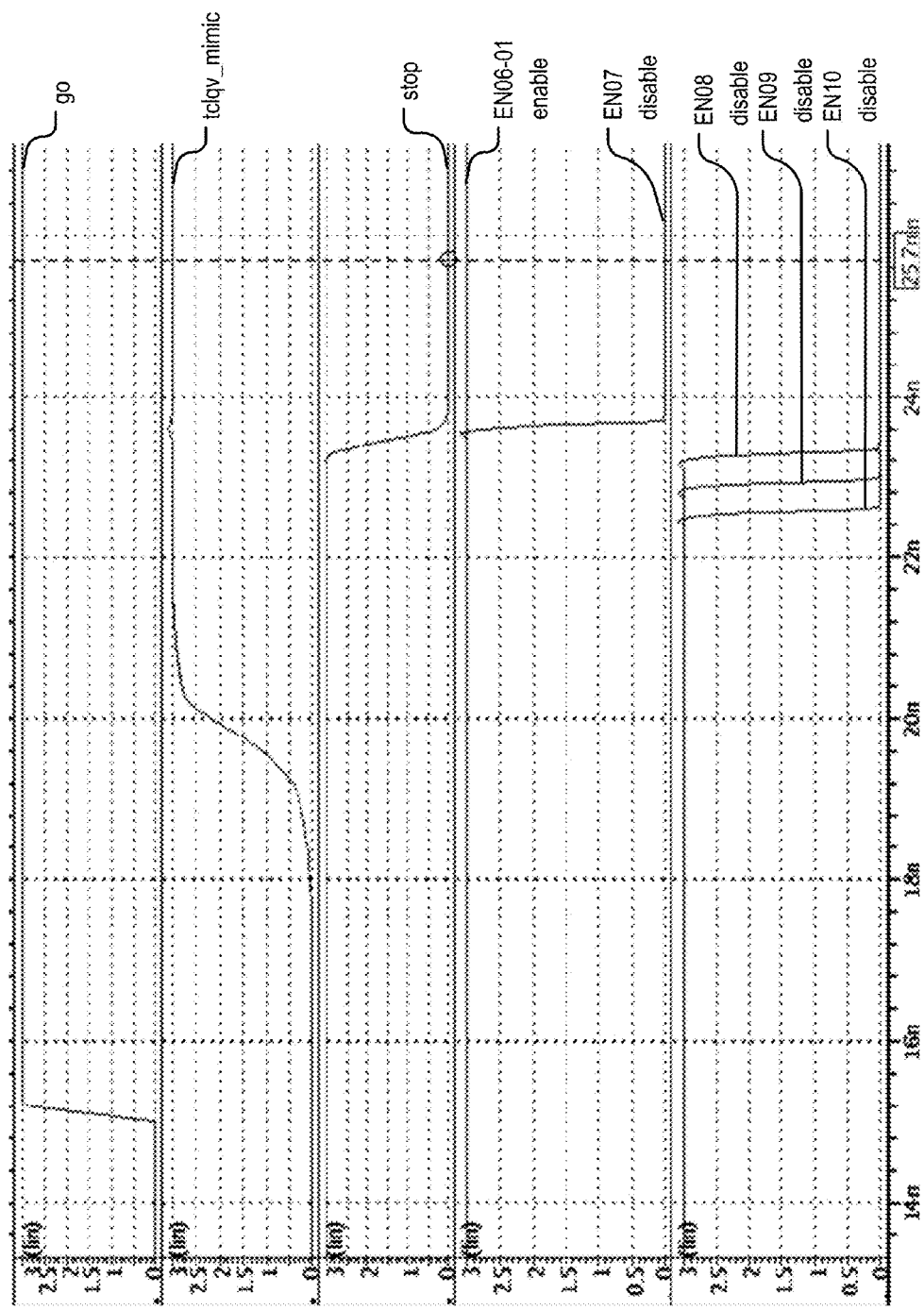
FIG. 14 is a graph of signal traces in the speed meter circuit in FIG. 4.

Inverter 1010 has an input coupled to the output of NAND gate 1004 and an output generating the OUT signal. If the IN signal goes high prior to the stop timing signal changing from high to low, the OUT signal is high; this corresponds to the tclqv_mimic signal transiting the sequential circuits and the transited sequential circuits turning off corresponding output drivers via the EN_x output or EN_x_B output. If the IN signal goes high after the stop timing signal changes from high to low, then the OUT signal is low; this corresponds to any subsequent sequential circuits causing the corresponding output drivers to stay turned on via the EN_x output or EN_x_B output. SR latch 1002 has an S input receiving a SET signal and an R input receiving the OUT signal. Inverter 1006 has an input coupled to the Q output of SR latch 1002 and an output generating the EN_x_B signal. Inverter 1008 has an input coupled to the QB output of SR latch 1002 and an output generating the EN_x signal. Examples traces of such output are shown in FIG. 14.

In other embodiments, the sequential circuits are a sequence of circuits such that an output of a prior sequential circuit is coupled to an input of a subsequent sequential circuit. Different sequential circuits can share the same components with each other, such as the same combinational logic and/or the same state logic such as flip-flops.

Figure 11:
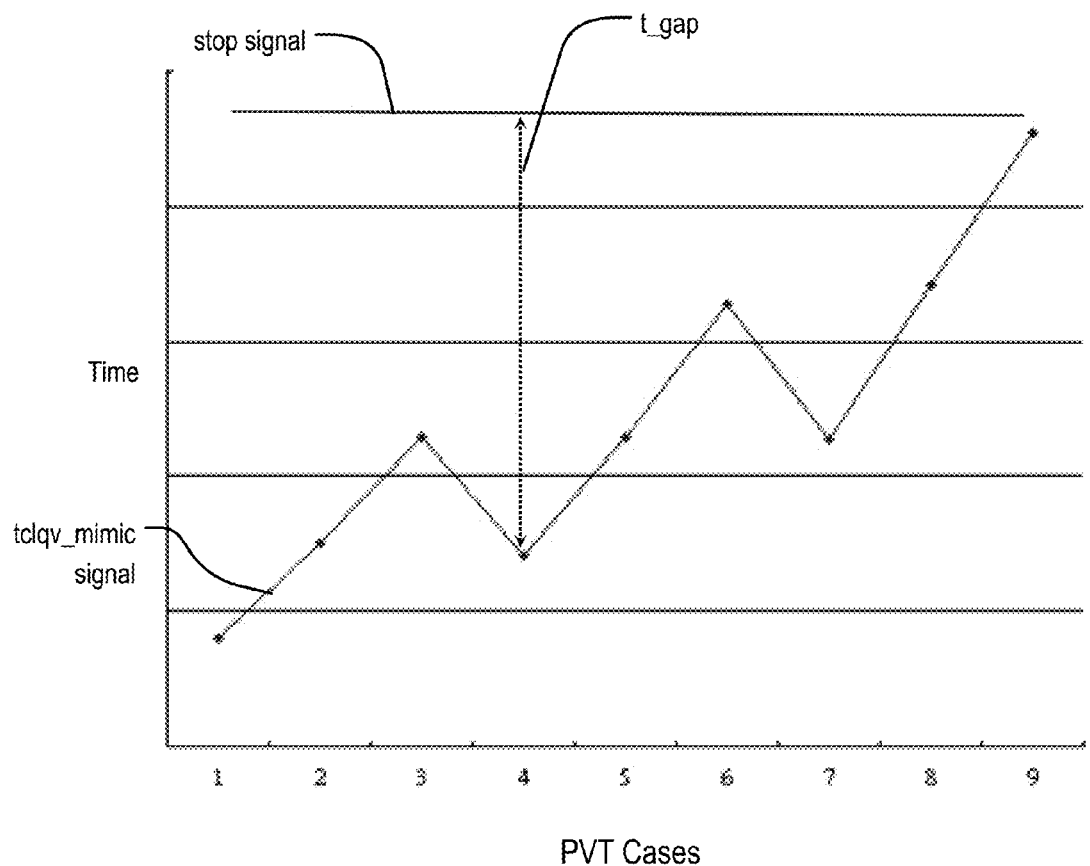
FIG. 11 is a graph of delays for signals from the delay emulation circuit and an ideal reference delay circuit.

FIG. 11 is a graph of delays for signals from the delay emulation circuit and an ideal reference delay circuit.

The tclqv_mimic timing signal is generated from the delay emulation circuit of FIG. 4. The tclqv_mimic signal emulates the dependency on varying supply voltage and/or varying temperature and/or varying process. Accordingly, the tclqv_mimic timing signal varies substantially with varying supply voltage and/or varying temperature and/or varying process.

By contrast, the stop timing signal is compensated for varying supply voltage, varying temperature, and varying process. Accordingly, the stop timing signal remains substantially constant despite varying supply voltage and/or varying temperature and/or varying process.

The value t_gap indicates the varying difference between the tclqv_mimic and stop timing signals. The speed meter circuit of FIGS. 3A and 4 measures t_gap in order to maintain an output buffer delay that is substantially constant despite variations in temperature, supply voltage, and/or process corner.

Figure 12:
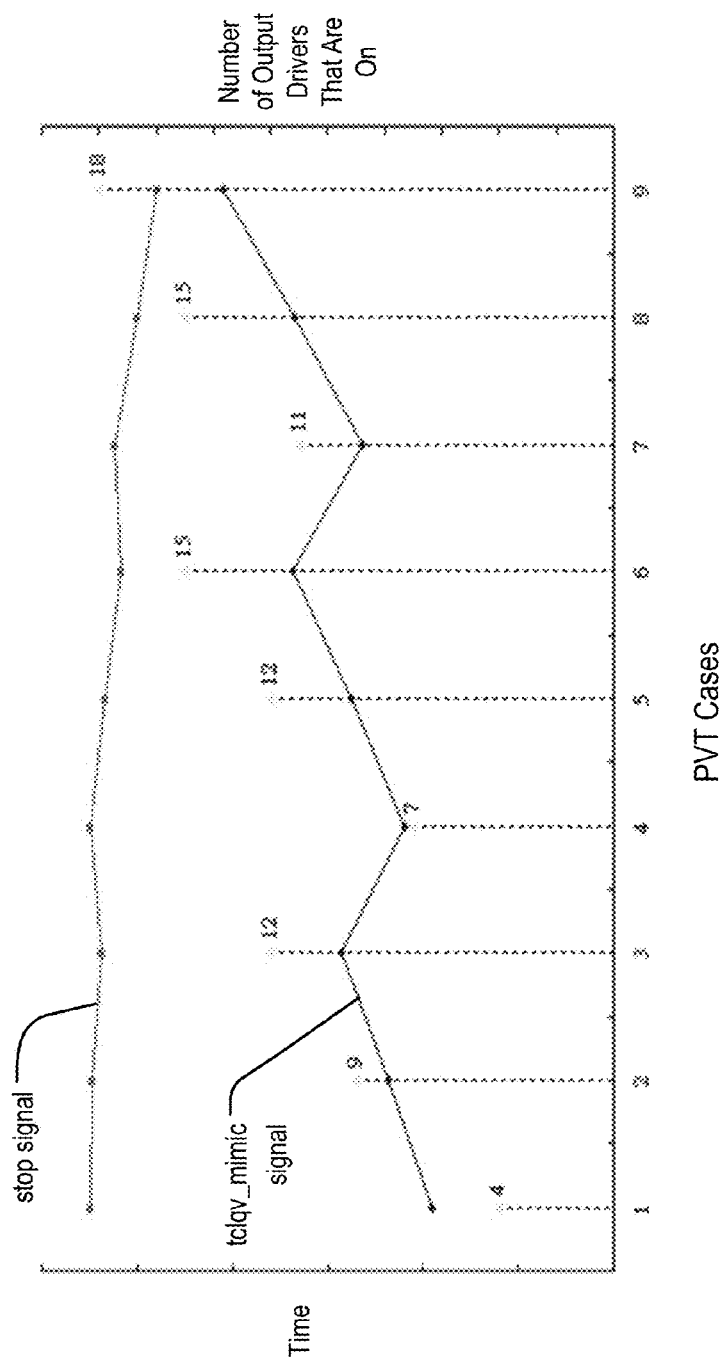
FIG. 12 is a graph of delays for signals from the delay emulation circuit and the reference delay circuit, and the number of output drivers that are on, for different PVT cases.

FIG. 12 is a graph of delays for signals from the delay emulation circuit and the reference delay circuit, and the number of output drivers that are on, for different PVT cases.

The tclqv_mimic timing and stop timing signals are discussed in connection with FIG. 12. The number on the graph corresponding to the vertical axis on the right of the graph indicates the number of output drivers that are on.

If the tclqv_mimic signal has a relatively high value, the emulated buffer delay is relatively long, such that the output buffer is expected to be relatively slow unless corrected. Accordingly, the speed meter circuit measurement results in turning on relatively more output drivers to reduce the actual output buffer delay to a more repeatable value despite variations in temperature, supply voltage, and/or process corner.

If the tclqv_mimic signal has a relatively low value, the emulated buffer delay is relatively short, such that the output buffer is expected to be relatively fast unless corrected. Accordingly, the speed meter circuit measurement results in turning on relatively few output drivers to increase the actual output buffer delay to a more repeatable value despite variations in temperature, supply voltage, and/or process corner.

Figure 13:
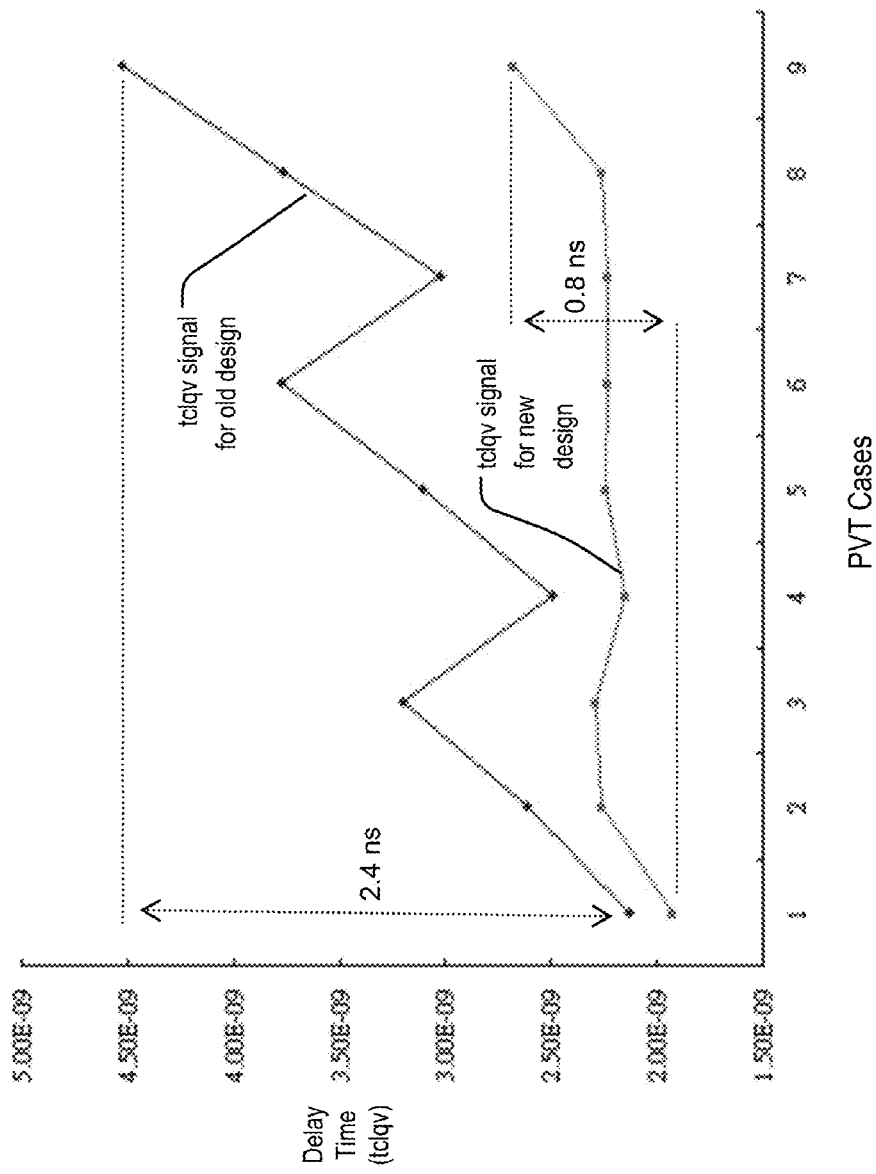
FIG. 13 is a graph of delays, showing the improvement of the new output buffer.

FIG. 13 is a graph of delay, showing the improvement of the new output buffer.

For an old design without the speed meter circuit as disclosed herein, the output buffer delay has a range that is 2.5 nanoseconds wide across variations in temperature and supply voltage.

By contrast, in an embodiment with the speed meter circuit as disclosed herein, the output buffer delay has a range that is 0.8 nanoseconds wide across variations in temperature and supply voltage.

FIG. 14 is a graph of signal traces in the speed meter circuit in FIG. 4.

Initially, the go signal is sent to the delay emulation circuit and reference delay circuit as in FIG. 4. In response to the go signal, the delay emulation circuit generates the tclqv_mimic timing signal after a delay which correlates with the output buffer delay.

The tclqv_mimic timing signal then transits the plurality of sequential circuits. When sequential circuit 10 is transited, sequential circuit 10 generates the EN10 disable signal. When sequential circuit 09 is transited, sequential circuit 09 generates the EN09 disable signal. When sequential circuit 08 is transited, sequential circuit 08 generates the EN08 disable signal. When sequential circuit 07 is transited, sequential circuit 07 generates the EN07 disable signal.

In response to the go signal, the reference delay circuit generates the stop timing signal after a delay which is substantially insensitive to at least one of process, voltage and temperature (PVT) conditions. The stop timing signal is received in parallel by the plurality of sequential circuits. In response to the stop timing signal, no further disable signals are generated by the plurality of sequential circuits. The remaining sequential circuits 06-01 continue to generate respective EN_# signals, from EN06 through EN01. As a result, output drivers corresponding to sequential circuits 10-07 are off, and output drivers corresponding to sequential circuits 06-01 are on.

Figure 15:
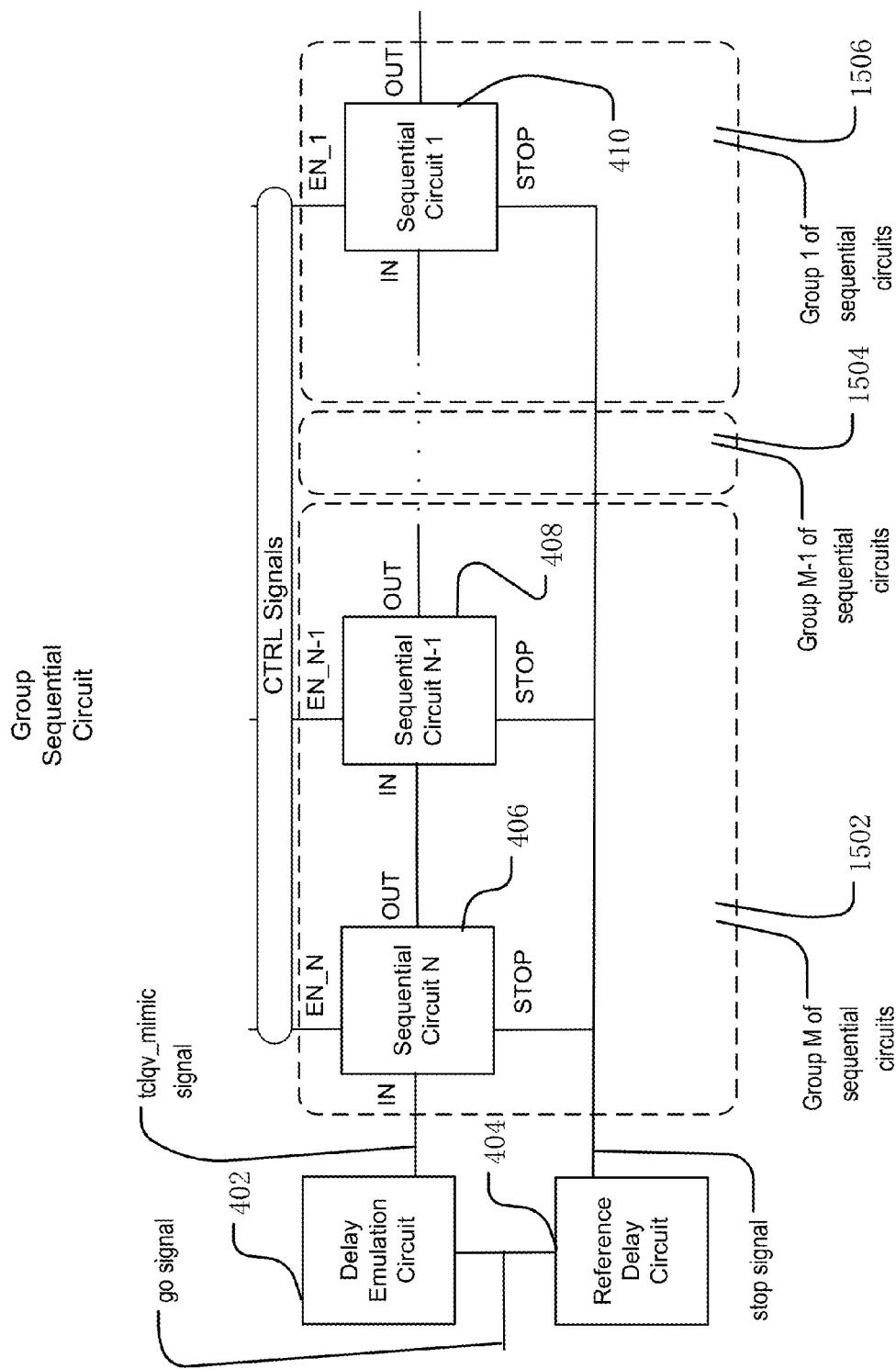
FIG. 15 is a block diagram of a speed meter circuit as in FIG. 4, with the sequential circuits organized into groups.

FIG. 15 is a block diagram of a speed meter circuit as in FIG. 4, with the sequential circuits organized into groups.

The plurality of sequential circuits is grouped into M groups. In this example, group M includes sequential circuit N 406 and sequential circuit N-1 408, group 1 1506 includes sequential circuit 1 410, and any intermediate groups such as group M-1 1504 include any intermediate sequential circuits. Grouping has the advantage of reducing layout area and current consumption of a large number of control signals from the individual sequential circuits, to a smaller number of control signals from the groups of sequential circuits. Reduced granularity of the output buffer delay is a cost of grouping.

Figure 16:
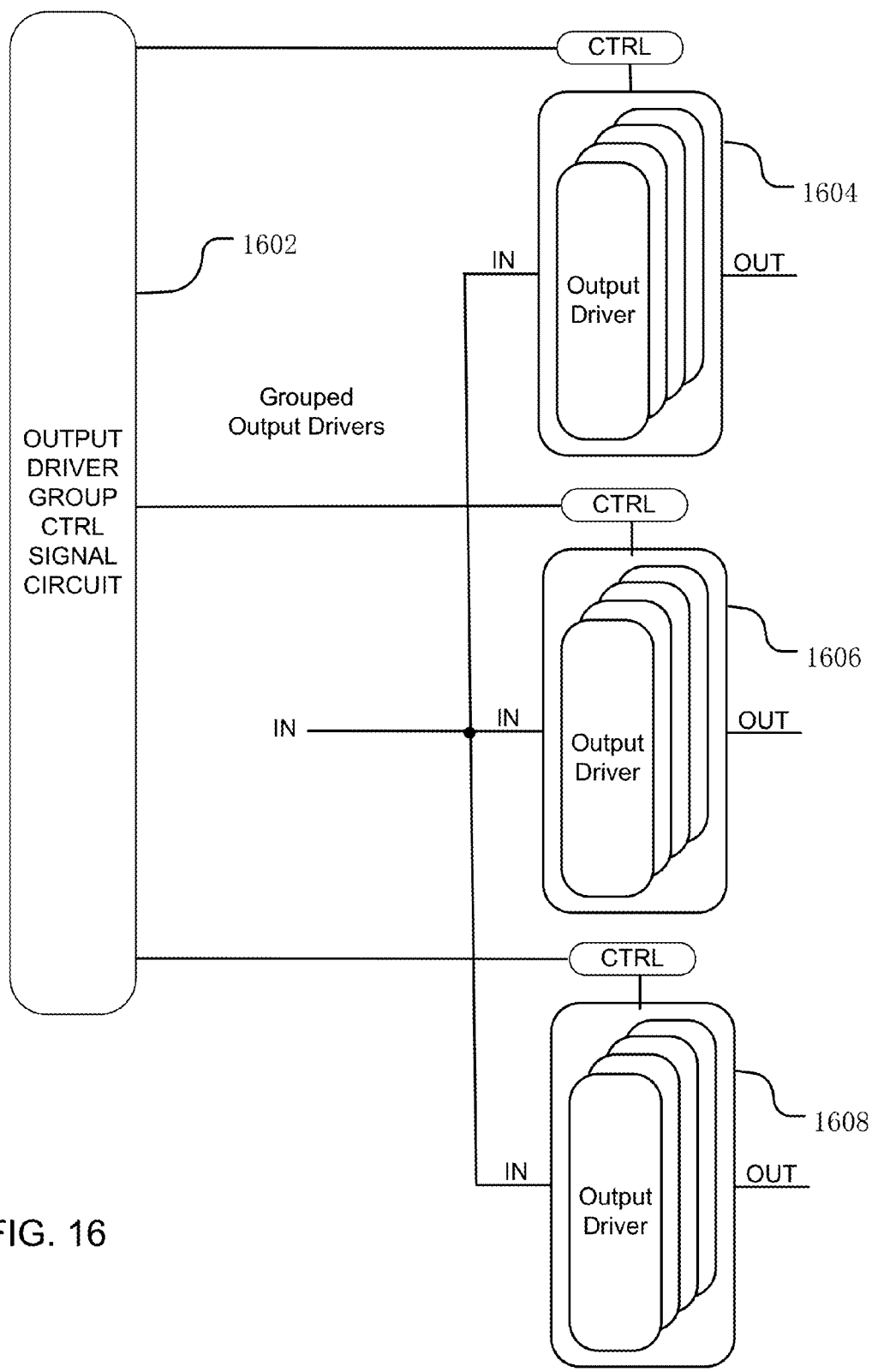
FIG. 16 illustrates an output buffer of 3B, with the output drivers organized into groups.

FIG. 16 illustrates an output buffer of 3B, with the output drivers organized into groups.

In the output buffer of FIG. 16, output drivers are grouped into output driver groups 1604, 1606, and 1608. In one example, output driver group 1604 is on or off depending on the control signals from group M in FIG. 15, output driver group 1606 is on or off depending on the control signals from group M-1 in FIG. 15, and output driver group 1608 is on or off depending on the control signals from group 1 in FIG. 15. The number of output drivers within a particular output driver group may be just one output driver, or multiple output drivers. The number of output drivers may be the same across the different output driver groups, or may be different. Output driver group control signal circuit 1602 processes the control signals from the individual sequential circuits in FIG. 15, such that a single output driver group control signal is generated by a single group of sequential circuits, and such that one output driver group is on at a time.

In an alternative embodiment, multiple output driver groups are on at one time such that their respective driving strengths are combined.

As discussed in connection with FIG. 17, output driver groups 1604, 1606, and 1608 are each on or off depending on the corresponding one of the SLOW, TYP, and FAST output driver group control signals. The output driver group controlled by the FAST output driver group control signal has the fewest number of output drivers, the smallest output drivers, or some combination of few and slow. The output driver group controlled by the SLOW output driver group control signal has the largest number of output drivers, the largest output drivers, or some combination of largest number and largest. The output driver group controlled by the TYP output driver group control signal has the medium number of output drivers, the medium size output drivers, or some combination of medium number and medium size.

Figure 17:
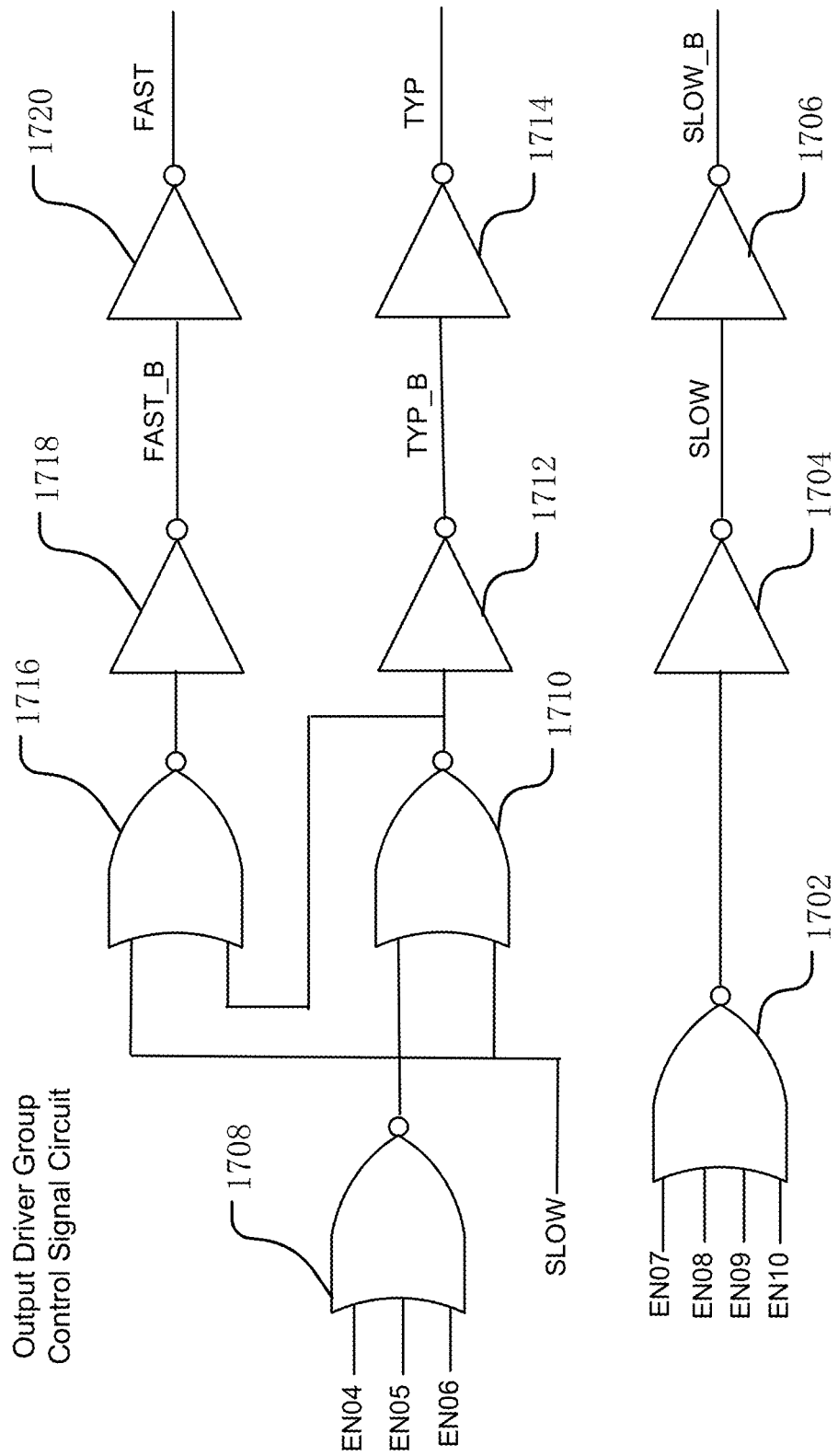
FIG. 17 is an example control signal circuit for the output buffer of FIG. 16.

FIG. 17 is an example control signal circuit for the output buffer of FIG. 16. This output driver group control signal circuit processes the control signals from the individual sequential circuits in FIG. 15, such that a single output driver group control signal is generated by a single group of sequential circuits which includes multiple sequential circuits, and such that one output driver group is on at a time.

NOR gate 1702 receives as inputs the signals EN07, EN08, EN09, EN10 from the sequential circuits of group M 1502 in FIG. 15. Inverter 1704 has an input coupled to the output of NOR gate 1702, and an output generating the SLOW output driver group control signal. Inverter 1706 has an input coupled to the output of inverter 1704 and an output generating SLOW_B which is the complement of SLOW.

So long as at least one of EN07, EN08, EN09, EN10 is high, the SLOW output driver group control signal is high.

When all of EN07, EN08, EN09, EN10 are low, the SLOW output driver group control signal is low and SLOW_B is high. So until the last sequential circuit in group M 1502 is transited by the tclqv_mimic signal, the SLOW output driver group control signal is high. After the last sequential circuit in group M 1502 is transited by the tclqv_mimic signal, the SLOW output driver group control signal is low.

NOR gate 1708 receives as inputs the signals EN04, EN05, EN06 from the sequential circuits of group M-1 1504 in FIG. 15. NOR gate 1710 receives as inputs the output of NOR gate 1708 and the SLOW output driver group control signal. Inverter 1712 has an input coupled to the output of NOR gate 1708, and an output generating TYP_B which is the complement of TYP. Inverter 1714 has an input coupled to the output of inverter 1712 and an output generating TYP output driver group control signal.

While the SLOW output driver group control signal is high, the TYP output driver group control signal is low. In this embodiment, a single output driver group control signal is high. If the SLOW output driver group control signal turns low, then the TYP output driver group control signal is high so long as at least one of EN04, EN05, EN06 is high. When all of EN04, EN05, EN06 are low, the TYP output driver group control signal is low and TYP_B is high. So after group M 1502 in FIG. 15 is transited by the tclqv_mimic signal, and until the last sequential circuit in group M-1 1504 is transited by the tclqv_mimic signal, the TYP output driver group control signal is high. After the last sequential circuit in group M-1 1504 is transited by the tclqv_mimic signal, the TYP output driver group control signal is low.

NOR gate 1716 receives as inputs the SLOW output driver group control signal and the TYP output driver group control signal. Inverter 1718 has an input coupled to the output of NOR gate 1716, and an output generating FAST_B which is the complement of FAST. Inverter 1720 has an input coupled to the output of inverter 1718 and an output generating FAST output driver group control signal.

While either the SLOW output driver group control signal is high, or the TYP output driver group control signal is high, the FAST output driver group control signal is low. The FAST output driver group control signal turns high after the TYP output driver group control signal turns low (by which time the SLOW output driver group control signal has turned low already). In this embodiment, a single output driver group control signal is high. Inputs from the last sequential circuits EN03, EN02, EN01 are unnecessary, as the FAST output driver group is the last output driver group remaining after all other output driver groups are off.

As a result, one of the SLOW output driver group control signal, the TYP output driver group control signal, and the FAST output driver group control signal is high. In FIG. 16, each of the output driver groups is controlled by a corresponding one of the SLOW, TYP, and FAST output driver group control signals.

Other embodiments have more than 3 output driver groups and more than 3 output driver group control signals.

Figure 18:
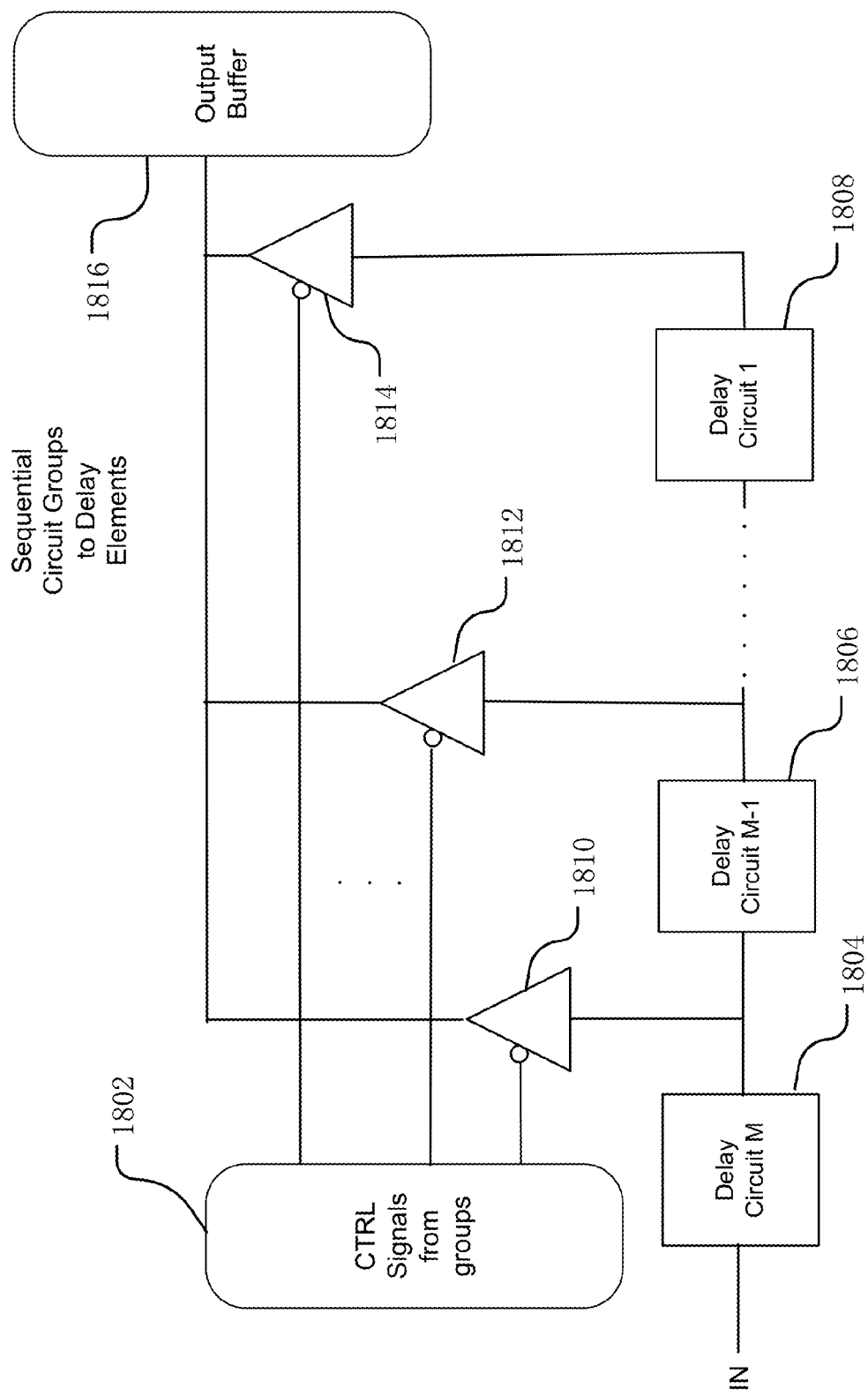
FIG. 18 is an example variable delay circuit for the output buffer of FIG. 16, responsive to the control signal circuit FIG. 17.

In another embodiment, each of the tri-state inverters in FIG. 18 is controlled by a corresponding one of the SLOW, TYP, and FAST output driver group control signals.

FIG. 18 is an example variable delay circuit for the output buffer of FIG. 16, responsive to the control signal circuit FIG. 17.

Signal IN is received by a plurality of delay circuits, which in one embodiment is a series of delay circuits, including delay circuit M 1804, delay circuit M-1 1806, and delay circuit 1 1808. Example delay circuits are delay elements such as a number of inverters. Tri-state buffer 1810 has an input coupled to the series of delay circuits in between delay circuit M 1804 and delay circuit M-1 1806. Tri-state buffer 1812 has an input coupled to the series of delay circuits after delay circuit M-1 1806. Tri-state buffer 1814 has an input coupled to the series of delay circuits after delay circuit 1 1808. The outputs of tri-state buffers 1810, 1812, and 1814 are coupled to the output buffer 1816. Accordingly, the IN signal transits a variable number of delay circuits and undergoes a variable delay to reach the output buffer 1816, depending on the particular tri-state buffer transited by the IN signal.

In the embodiment of FIG. 18, the different sequential circuit groups of FIG. 15 generate control signals that undergo different amounts of delay. Tri-state buffers 1810, 1812, and 1812 are controlled by a corresponding one of the SLOW, TYP, and FAST output driver control signals from 1802, as discussed in FIG. 17. The FAST output driver control signal is received by tristate buffer 1814. The TYP output driver control signal is received by tristate buffer 1812. The SLOW output driver control signal is received by tristate buffer 1810.

The IN signal transits a maximum number of the delay circuits in order to reach tri-state buffer 1814. So in the case that the tri-state buffer 1814 is enabled by the FAST output driver control signal, the IN signal has undergone the maximum amount of delay prior to receipt by the tri-state buffer 1814 and subsequent receipt of the IN signal by the output buffer 1816.

The IN signal transits a minimum number of the delay circuits in order to reach tri-state buffer 1810. So in the case that the tri-state buffer 1810 is enabled by the SLOW output driver control signal, the IN signal has undergone the minimum amount of delay prior to receipt by the tri-state buffer 1810 and subsequent receipt of the IN signal by the output buffer 1816.

The IN signal transits an intermediate number of the delay circuits in order to reach tri-state buffer 1812. So in the case that the tri-state buffer 1812 is enabled by the TYP output driver control signal, the IN signal has undergone the intermediate amount of delay prior to receipt by the tri-state buffer 1812 and subsequent receipt of the IN signal by the output buffer 1816.

If the tclqv_mimic signal has a relatively high value, the emulated buffer delay is relatively long, such that the output buffer is expected to be relatively slow unless corrected. Accordingly, the speed meter circuit measurement results in short amount of the variable delay so the combination of delays results in an actual output buffer delay having a more repeatable value despite variations in temperature, supply voltage, and/or process corner.

If the tclqv_mimic signal has a relatively low value, the emulated buffer delay is relatively short, such that the output buffer is expected to be relatively fast unless corrected. Accordingly, the speed meter circuit measurement results in a lengthy amount of the variable delay so the combination of delays results in an actual output buffer delay having a more repeatable value despite variations in temperature, supply voltage, and/or process corner.

If the tclqv_mimic signal has an intermediate value, the speed meter circuit measurement results in an intermediate amount of the variable delay so the combination of delays results in an actual output buffer delay having a more repeatable value despite variations in temperature, supply voltage, and/or process corner.

Figure 19:
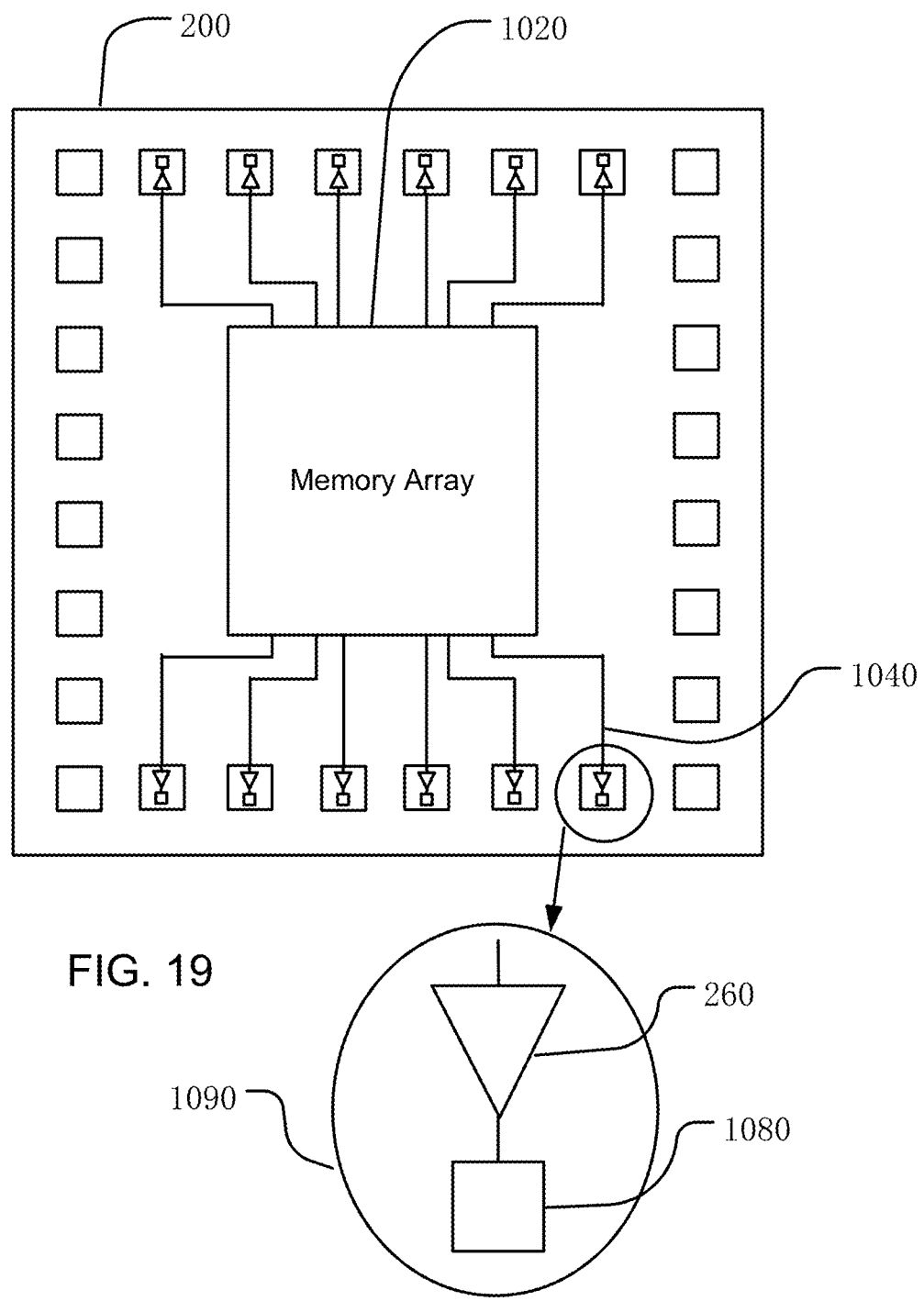
FIG. 19 is a chip diagram of an example integrated circuit.

FIG. 19 is a chip diagram of an example integrated circuit 200. The integrated circuit 200 includes wiring terminals configured for connection to circuitry off of the integrated circuit 200, and wherein the output of the output buffer is connected to the wiring terminal. Wiring terminals can comprise pads for wire bonding to an IC package, "bumps" for flip chip bonding, through silicon via contacts for stacked ICs and the other terminals configured for connection to off-chip communications of the outputs of the output buffers. The integrated circuit 200 in this example, includes a memory array 1020 coupled to output buffers 260 via wiring 1040. In other examples, the integrated circuit may include processors, logic, analog circuits and so on, alone or in combination with other IC components. Circle 1090 illustrates that the output of an output buffer 260 is connected to a wiring terminal 1080.

The integrated circuit 200 includes a plurality of output buffers including the output buffer 260. The output buffers have output buffer delays adjustable in response to the control signals CTRL. The control signals CTRL are generated by control circuits 300 to control the plurality of output buffers. The control signals CTRL generated by one control circuit 300 may be applied to the set of control inputs of more than one of the output buffers in the plurality of output buffers. As shown in FIG. 2A, one control circuit 300 is coupled to one output buffer 260. In general, one control circuit 300 can be coupled to one or many output buffers 260. Further, the integrated circuit 200 can include multiple control circuits, each coupled to one or many output buffers. The number of output buffers coupled to a control circuit may be different from the number of output buffers coupled to another control circuit.

While the present technology is disclosed by reference to the preferred implementations and examples detailed above, it is to be understood that these examples are intended in an illustrative rather than in a limiting sense. It is contemplated that modifications and combinations will readily occur to those skilled in the art, which modifications and combinations will be within the spirit of the technology and the scope of the following claims. What is claimed is:

What is claimed is:

1. An integrated circuit comprising:
an output buffer having an output buffer delay, a signal input and a signal output, the output buffer having a variable number of a plurality of output drivers that are on, in response to output driver control signals; and
a plurality of sequential circuits receiving as input first and second timing signals, wherein relative timing of the first and second timing signals determines the variable number of output drivers;
a control circuit: (i) using a first circuit to generate the first timing signal with a first delay, (ii) using a second circuit to generate the second timing signal with a second delay that correlates with the output buffer delay, (iii) using the plurality of sequential circuits to generate the output driver control signals, and (iv) causing the variable number of the plurality of output drivers to be on, in response to the output driver control signals.

2. The integrated circuit of claim 1, wherein the variable number of output drivers depends on a number of the sequential circuits transited by the second timing signal until the plurality of sequential circuits receive the first timing signal.

3. The integrated circuit of claim 1, wherein
the first delay circuit responds to a reference signal to generate the first timing signal with the first delay, and wherein the first delay is substantially insensitive to at least one of process, voltage and temperature (PVT) conditions; and
the second circuit responds to the reference signal on its input to generate the second timing signal on its output with the second delay, and wherein the second delay correlates with changes in the output buffer delay resulting from said at least one of process, voltage and temperature (PVT) conditions.

4. The integrated circuit of claim 1, wherein the plurality of output drivers are in parallel, and the output buffer delay is shortened or lengthened by the variable number of output drivers being more or less.

5. The integrated circuit of claim 1, wherein the plurality of output drivers are divided into a plurality of groups of output drivers, and a same sequential circuit driver in the plurality of sequential circuits controls different output drivers within a same group of the plurality of groups of output drivers.

6. The integrated circuit of claim 5, wherein the plurality of sequential circuits are divided into a plurality of groups of sequential circuits, and different sequential circuits in a same group of the plurality of groups of sequential circuits control the same group of the plurality of groups of output drivers.

7. The integrated circuit of claim 1, wherein the plurality of sequential circuits are divided into a plurality of groups of sequential circuits, and different sequential circuits in a same group of the plurality of groups of sequential circuits control a same output driver in the plurality of output drivers.

8. An integrated circuit comprising:
an output buffer having an output buffer delay, a signal input and a signal output, and a control signal input receiving an output driver control signal;
a plurality of sequential circuits receiving as input first and second timing signals, the first timing signal generated from a first delay circuit, the second timing signal generated with a second delay that correlates with the output buffer delay;
a plurality of delay circuits generating a variable delay determining the output buffer delay, the variable delay depending on a number of the plurality of sequential circuits transited by the second timing signal until the plurality of sequential circuits receive the first timing signal;
a control circuit: (i) using the first delay circuit to generate the first timing signal with a first delay, (ii) using a second delay circuit to generate the second timing signal with the second delay that correlates with the output buffer delay, (iii) using the plurality of sequential circuits to generate the output driver control signal, and (iv) causing the output driver control signal to undergo the variable delay in order to reach the output buffer.

9. The integrated circuit of claim 8, wherein
the first delay circuit responds to a reference signal to generate the first timing signal with the first delay, and wherein the first delay is substantially insensitive to at least one of process, voltage and temperature (PVT) conditions; and
the second delay circuit responds to the reference signal to generate the second timing signal with the second delay, and wherein the second delay correlates with changes in the output buffer delay resulting from said at least one of process, voltage and temperature (PVT) conditions.

10. The integrated circuit of claim 8, wherein the plurality of sequential circuits are divided into a plurality of groups of sequential circuits, and a same delay is generated by the plurality of delay circuits responsive to different sequential circuits within a same group of the plurality of groups of sequential circuits.

11. The integrated circuit of claim 8, wherein the plurality of sequential circuits are divided into a plurality of groups of sequential circuits, and the variable delay is a same value caused by output driver signals generated from different sequential circuits within a same group of the plurality of groups of sequential circuits.

12. A method for controlling an output buffer, where the output buffer has an output buffer delay, comprising:

generating a first timing signal with a first delay;

generating a second timing signal with a second delay that correlates with the output buffer delay; and adjusting a variable number of output drivers that are on in a plurality of output drivers in the output buffer, in response to a number of sequential circuits of a plurality of sequential circuits transited by the second timing signal upon receipt by the plurality of sequential circuits of the first timing signal.

13. The method of claim 12, including using a reference delay circuit which responds to a reference signal to generate the first timing signal, and wherein the first delay is substantially insensitive to at least one of process, voltage and temperature (PVT) conditions; and using a delay emulation circuit which responds to the reference signal to generate the second timing signal, and wherein the second delay correlates with changes in the output buffer delay resulting from said at least one of process, voltage and temperature (PVT) conditions.

14. The method of claim 12, wherein the output buffer comprises a plurality of parallel output drivers, and the output buffer delay is shortened or lengthened by the variable number of output drivers being more or less.

15. The method of claim 12, wherein the plurality of output drivers are divided into a plurality of groups of output drivers, and a same sequential circuit driver in the plurality of sequential circuits controls different output drivers within a same group of the plurality of groups of output drivers.

16. The method of claim 15, wherein the plurality of sequential circuits are divided into a plurality of groups of sequential circuits, and different sequential circuits drivers in a same group of the plurality of groups of sequential circuits control the same group of the plurality of groups of output drivers.

* * * * *